(12) United States Patent
Liu et al.

(10) Patent No.: US 12,513,878 B2
(45) Date of Patent: Dec. 30, 2025

(54) BIT CELL WITH ISOLATING WALL

(71) Applicants: IMEC VZW, Leuven (BE); Katholieke Universiteit Leuven, Leuven (BE)

(72) Inventors: Hsiao-Hsuan Liu, Leuven (BE); Shairfe Muhammad Salahuddin, Kessel-Lo (BE); Boon Teik Chan, Wilsele (BE)

(73) Assignee: Imec VZW, Leuven (BE)

( * ) Notice: Subject to any disclaimer, the term of this patent is extended or adjusted under 35 U.S.C. 154(b) by 411 days.

(21) Appl. No.: 18/335,320

(22) Filed: Jun. 15, 2023

(65) Prior Publication Data

US 2023/0413505 A1    Dec. 21, 2023

(30) Foreign Application Priority Data

Jun. 15, 2022 (EP) .................................... 22179212

(51) Int. Cl.
H10B 10/00    (2023.01)
(52) U.S. Cl.
CPC .................................. H10B 10/125 (2023.02)
(58) Field of Classification Search
CPC .... H10B 10/125; H10D 30/43; H10D 30/501; H10D 62/121; H10D 89/10
See application file for complete search history.

(56) References Cited

U.S. PATENT DOCUMENTS

| | | | |
|---|---|---|---|
| 9,551,923 B2 | 1/2017 | Wang et al. | |
| 9,991,268 B1 * | 6/2018 | Liaw | H01L 23/528 |
| 10,411,010 B2 | 9/2019 | Xie et al. | |
| 10,692,990 B2 | 6/2020 | Bao et al. | |
| 10,832,916 B1 | 11/2020 | Xie et al. | |
| 11,024,632 B2 * | 6/2021 | Liaw | G11C 5/063 |
| 11,152,464 B1 | 10/2021 | Pranatharthi Haran et al. | |
| 11,164,866 B2 | 11/2021 | Ju et al. | |
| 2016/0133632 A1 | 5/2016 | Park et al. | |
| 2021/0265223 A1 | 8/2021 | Yang et al. | |
| 2021/0305244 A1 | 9/2021 | Bouche et al. | |
| 2022/0102362 A1 | 3/2022 | Chanemougame et al. | |

OTHER PUBLICATIONS

Extended European Search Report and Search Opinion, Application No. EP 22179212.0, mailed Dec. 8, 2022, 9 pages.

(Continued)

*Primary Examiner* — David Vu
(74) *Attorney, Agent, or Firm* — McDonnell Boehnen Hulbert & Berghoff LLP

(57) ABSTRACT

A bit cell for a Static Random-Access Memory (SRAM) is provided that includes a first and second pair of complementary transistors as well as a first pass-gate transistor and a second pass-gate transistor. A first inverter gate electrode forms a common gate electrode for the first pair of complementary transistors and a second inverter gate electrode forms a common gate electrode for the second pair of complementary transistors. Further, a first pass gate electrode forms a gate of the first pass-gate transistor and a second pass gate electrode forms a gate of the second pass-gate transistor. A first and a second dielectric wall are also provided, separating the first pass gate electrode from the first inverter gate electrode, and the second pass gate electrode from the second inverter gate electrode.

20 Claims, 14 Drawing Sheets

(56) References Cited

OTHER PUBLICATIONS

Weckx, Pieter, Julien Ryckaert, E. Dentoni Litta, Dmitry Yakimets, Philippe Matagne, Pieter Schuddinck, Doyoung Jang et al. "Novel forksheet device architecture as ultimate logic scaling device towards 2nm." In 2019 IEEE International Electron Devices Meeting (IEDM), pp. 36-5. IEEE, 2019.

Fei, Sun Li, Wang Qing Peng, Zhang Ji Hong, and Chi Yu Shan. "Exploring Gate-Cut Patterning Approaches Using Simulation and Defect Modelling." In 2021 China Semiconductor Technology International Conference (CSTIC), pp. 1-4. IEEE, 2021.

* cited by examiner

BIT CELL WITH ISOLATING WALL

CROSS-REFERENCE TO RELATED APPLICATIONS

The present application is a non-provisional patent application claiming priority to European Patent Application No. EP 22179212.0, filed on Jun. 15, 2022, the contents of which are hereby incorporated by reference.

FIELD OF THE DISCLOSURE

The present disclosure relates to relates to a bit cell for a Static Random-Access Memory (SRAM) arranged on a semiconductor substrate, as well as a method for forming such a bit cell.

BACKGROUND

The design of integrated circuits typically involves combining a great number of functional cells, each cell including a plurality of transistors interconnected to provide a desired function. Memory circuits comprise a plurality of memory bit cells configured to store one or more bits. One notable example of a memory circuit is the Static Random-Access Memory (SRAM). In conventional SRAM technology, the bit cells occupy a relatively large portion of the total die surface area.

While continuing advances in miniaturisation of transistors have resulted in ever smaller cells designs and thus denser circuits, the development of transistors of decreasing dimensions may by itself not be enough to enable area efficient circuitry.

SUMMARY

The present disclosure provides a bit cell for an SRAM enabling an area efficient circuit design.

According to a first aspect, there is provided a bit cell for an SRAM arranged on a semiconductor substrate, the bit cell comprising: (i) a first pair of complementary transistors including a first pull-up transistor and a first pull-down transistor; (ii) a second pair of complementary transistors including a second pull-up transistor and a second pull-down transistor; (iii) a first pass-gate transistor; and (iv) a second pass-gate transistor; wherein each transistor of the bit cell comprises a respective semiconductor channel extending between respective source and drain regions along a respective horizontal channel track; wherein the bit cell further comprises: (v) a first inverter gate electrode forming a common gate electrode for the semiconductor channels of the first pair of complementary transistors and a second inverter gate electrode forming a common gate electrode for the semiconductor channels of the second pair of complementary transistors, wherein the first and the second inverter gate electrodes extend in a respective horizontal gate track transverse to the channel tracks; (vi) a first pass gate electrode forming a gate of the first pass-gate transistor and being aligned with the first inverter gate electrode; (vii) a second pass gate electrode forming a gate of the second pass-gate transistor and being aligned with the second inverter gate electrode; (viii) a first dielectric wall formed in a trench separating the first pass gate electrode from the first inverter gate electrode; and (ix) a second dielectric wall formed in a trench separating the second pass gate electrode from the second inverter gate electrode.

According to a second aspect, a method for forming a bit cell for a Static Random-Access Memory (SRAM) is provided that includes (a) forming, on a semiconductor substrate: (i) a first pair of complementary transistors including a first pull-up transistor and a first pull-down transistor; (ii) a second pair of complementary transistors including a second pull-up transistor and a second pull-down transistor; (iii) a first pass-gate transistor; and (iv) a second pass-gate transistor; wherein each transistor of the bit cell comprises a semiconductor channel extending between respective source and drain regions along a respective horizontal channel track; wherein forming the first pair of complementary transistors comprises forming a first inverter gate electrode at the respective semiconductor channel of the first pair of complementary transistors, thereby providing a common gate electrode for the first pair of complementary transistors; wherein forming the second pair of complementary transistors comprises forming a second inverter gate electrode at the respective semiconductor channel of the second pair of complementary transistors, thereby providing a common gate electrode for the second pair of complementary transistors; wherein forming the first and second pass-gate transistors comprises forming a first pass-gate electrode forming a gate of the first pass-gate transistor, aligned with the first inverter gate electrode, and forming a second pass-gate electrode forming a gate of the second pass-gate transistor, aligned with the second inverter gate electrode; and wherein the method further comprises: (b) forming a trench separating the first pass gate electrode from the first inverter gate electrode and filling the trench with a dielectric material, thereby forming a first dielectric wall separating the first pass gate and the first inverter gate electrode; and (c) forming a trench separating the second pass gate electrode from the second inverter gate electrode and filling the trench with a dielectric material, thereby forming a second dielectric wall separating the second pass gate and the second inverter gate electrode.

The bit cell design described herein allows the device area and circuit density to be scaled by employing first and second dielectric walls for separating the first pass gate electrode from the first inverter gate electrode and the second pass gate electrode from the second inverter gate electrode. This provides a benefit relative to embodiments wherein the gate electrodes are formed by a gate cut, in which a continuous gate electrode is etched and split into two separate electrodes that are separated from each other. When reducing the spacing between the channel tracks, the precision with which the gate cut can be performed risks being the limiting factor that determines the minimum possible spacing between the channel tracks. The precision of the gate cut relies, among other factors, on the precision of the available patterning techniques and the selectivity of the etch process used. Overlay and alignment errors in the lithographic patterning process result in dimensional margins that risk increasing the spacing between the channel tracks, preventing the device size from being reduced to even smaller dimensions. By replacing the gate cut with a dielectric wall, which may be formed prior to the gate electrodes, the end portions of two aligned gate electrodes can be separated at a tighter pitch than otherwise would have been possible.

A complementary pair of transistors may comprise a pair of transistors having opposite channel types, e.g., an n-type transistor and a p-type transistor. The first and second complementary transistor pairs may be configured as a respective inverter pair. The two inverter pairs together form a pair of cross-coupled inverters by means of cross-coupled contacts.

As already mentioned, one of the transistors of each complementary transistor pair may be configured as a pull-up transistor and the other transistor of the pair may be configured as a pull-down transistor. The designation "pull-up", "pull-down" or "pass" for a transistor should herein be construed as the transistor being adapted to function or operate as a pull-up, pull-down, or pass transistor, respectively, in the context of the conventional understanding of CMOS inverters or SRAM bit cells.

The transistors may be field-effect transistors (FETs). The first complementary transistor pair may accordingly comprise a first CMOS pair, i.e., a first nFET (i.e., an n-type FET) and a first pFET (i.e., a p-type FET). Correspondingly, the second complementary transistor pair may comprise a second CMOS pair. The first and second pass transistors may each be an nFET or a pFET.

Each transistor comprises a semiconductor channel extending along a channel track, which may be a fin track in examples wherein the transistor is a fin-based transistor such as a fin-FET. Two or more of the transistors may have channels extending along the same track, depending on the particular layout of the bit cell. A track, or channel track, may thus be defined as the horizontal geometrical line which the channel of a transistor is formed along and parallel to.

Two or more of the gate electrodes (e.g., inverter gate electrodes and pass gate electrodes) may extend along the same gate track(s). A gate track may thus be defined as the horizontal geometrical line which gate electrodes are formed along and parallel to. The gate tracks can be orthogonal to the channel tracks.

Where the first inverter gate electrode forms a common gate electrode for the semiconductor channels of the first pair of complementary transistors, the first inverter gate electrode may be configured to control the conductivity of both semiconductor channels of the first pair of complementary transistors. The first inverter gate electrode may enclose the semiconductor channels of the first pair of complementary transistors partially or completely.

Where the second inverter gate electrode forms a common gate electrode for the semiconductor channels of the second pair of complementary transistors, the second inverter gate electrode may be configured to control the conductivity of both semiconductor channels of the second pair of complementary transistors. The second inverter gate electrode may enclose the semiconductor channels of the second pair of complementary transistors partially or completely.

Where the first pass gate electrode forms a gate for the semiconductor channel of the first pass-gate transistor, the first pass gate electrode may be configured to control the conductivity of the semiconductor channel of first pass-gate transistor. The first pass gate electrode may enclose the first pass-gate transistor channel partially or completely.

Where the second pass gate electrode forms a gate for the semiconductor channel of the second pass-gate transistor, the second pass gate electrode may be configured to control the conductivity of the semiconductor channel of second pass-gate transistor. The second pass gate electrode may enclose the second pass-gate transistor channel partially or completely.

Relative spatial terms such as "vertical", "upper", "lower" "stacked on top of" are herein to be understood as denoting locations or directions in relation to a direction normal to the device substrate, or in relation to a bottom-up direction of the device layer stack. Correspondingly, terms such as "lateral" and "horizontal" are to be understood as locations or directions parallel to the plane of the device substrate, e.g., parallel to an upper surface or to the main plane of extension of the device substrate.

In some embodiments, the semiconductor channels of each transistor of the bit cell may be arranged in a common horizontal plane. The resulting bit cell may hence be referred to as a planar bit cell. Various cell topologies are conceivable within the scope of the present disclosure, depending on the selected layout of the inverters formed by the first and second pairs of complementary transistors. The semiconductor channels of the first pull-down transistor and the first pass-gate transistor may, for instance, be aligned in a common channel track, whereas the semiconductor channels of the second pull-down transistor and the second pass-gate transistor may be aligned in a common second channel track. Further examples will be discussed in connection with the detailed description of the drawings.

In some embodiments, the first and second pairs of complementary transistors may be arranged in respective vertical stacks, with each of the first and second inverter gate electrodes extending vertically between the pull-up transistor and the pull-down transistor of the respective transistor pair. In other words, each transistor pair is arranged in a vertical arrangement with a first one of the transistors of the pair at a lower first level and the other one of the transistors at an upper second level, or at different distances from the substrate, as viewed along a vertical direction. In this layout, the semiconductor channels of the first pull-up transistor and the first pass-gate transistor may be aligned in a common first channel track, and the semiconductor channels of the second pull-up transistor and the second pass-gate transistor may be aligned in a common second channel track. The first channel track and the second channel track may be arranged at a first vertical level above the substrate, allowing the first and second pull-down transistor to be arranged at a second vertical level being either above or below the first level.

The above layout, in which each transistor pair is arranged in a vertical stack, i.e., on top of each other as seen from above the plane of the substrate, may be referred to as a vertical layout and the transistor pairs as vertically stacked complementary FETs, or CFETs. This is an efficient way of reducing the bit cell area, and of reducing the lateral spacing between adjacent channel tracks.

In some embodiments, the first and second dielectric walls may extend vertically between the first and second level and horizontally between the vertical stacks of complementary transistors. The presence of the insulating wall provides electrical separation between the pass-gate electrodes and the inverter gate electrodes in vertical layouts, thereby allowing the spacing between neighbouring channel tracks to be even further reduced. Due to the vertical layout of the bit cell, the first and second dielectric wall may form a common wall, e.g., may form part of the same wall structure.

The bit cell configurations described herein allow for dielectric walls having a thickness of 10 nanometres (nm) or less, such as 8 nm or less.

The semiconductor channel of each transistor of a bit cell as described herein may in some examples be formed of respective fin portions. Such a structure may also be referred to as an elongated layer stack with a longitudinal dimension oriented along the substrate, along a channel track, and protruding vertically therefrom. The semiconductor channel of one or more transistors of such a bit cell may be formed in one or more horizontal semiconductor nanowires. The gate electrodes may accordingly be configured as "gate all around" electrodes completely enclosing/wrapping around the channel region of the respective one or more nanowires. A horizontal semiconductor nanowire may herein refer to a semiconductor structure extending horizontally along the substrate and being suspended above the substrate. The nanowire may form a semiconductor body having a closed circumferentially extending bounding surface. Various aspect ratios are possible, such as a width to height ratio close to unity, or a width to height ratio greater than one (such as a horizontally oriented nano-sheet semiconductor structure) or smaller than one (such as a vertically oriented nano-sheet). The source and drain regions of the transistor may also be formed in opposite ends of the nanowire. Source and drain contacts of the transistor may completely enclose/wrap around the source and drain regions of the respective one or more nanowires.

The dielectric wall may be formed by depositing a dielectric material in a gap defined by sidewall spacers arranged on neighbouring fin portions, or elongated layer stacks, as will be discussed in further detail with reference to the drawings. This allows for the thickness of the dielectric wall to be defined by the thickness of the sidewall spacers, and the sidewall to be self-aligned between the fins.

BRIEF DESCRIPTION OF THE FIGURES

The above, as well as additional objects, features, and benefits, may be understood through the following illustrative and non-limiting detailed description, with reference to the appended drawings. In the drawings like reference numerals will be used for like elements unless stated otherwise.

All the figures are schematic, not necessarily to scale, and generally only show parts which are necessary to elucidate example embodiments, wherein other parts may be omitted or merely suggested.

DETAILED DESCRIPTION

Bit cells for an SRAM arranged on a semiconductor substrate, as well as methods for forming such bit cells, will in the following be described with reference to the figures.

Figure 1:
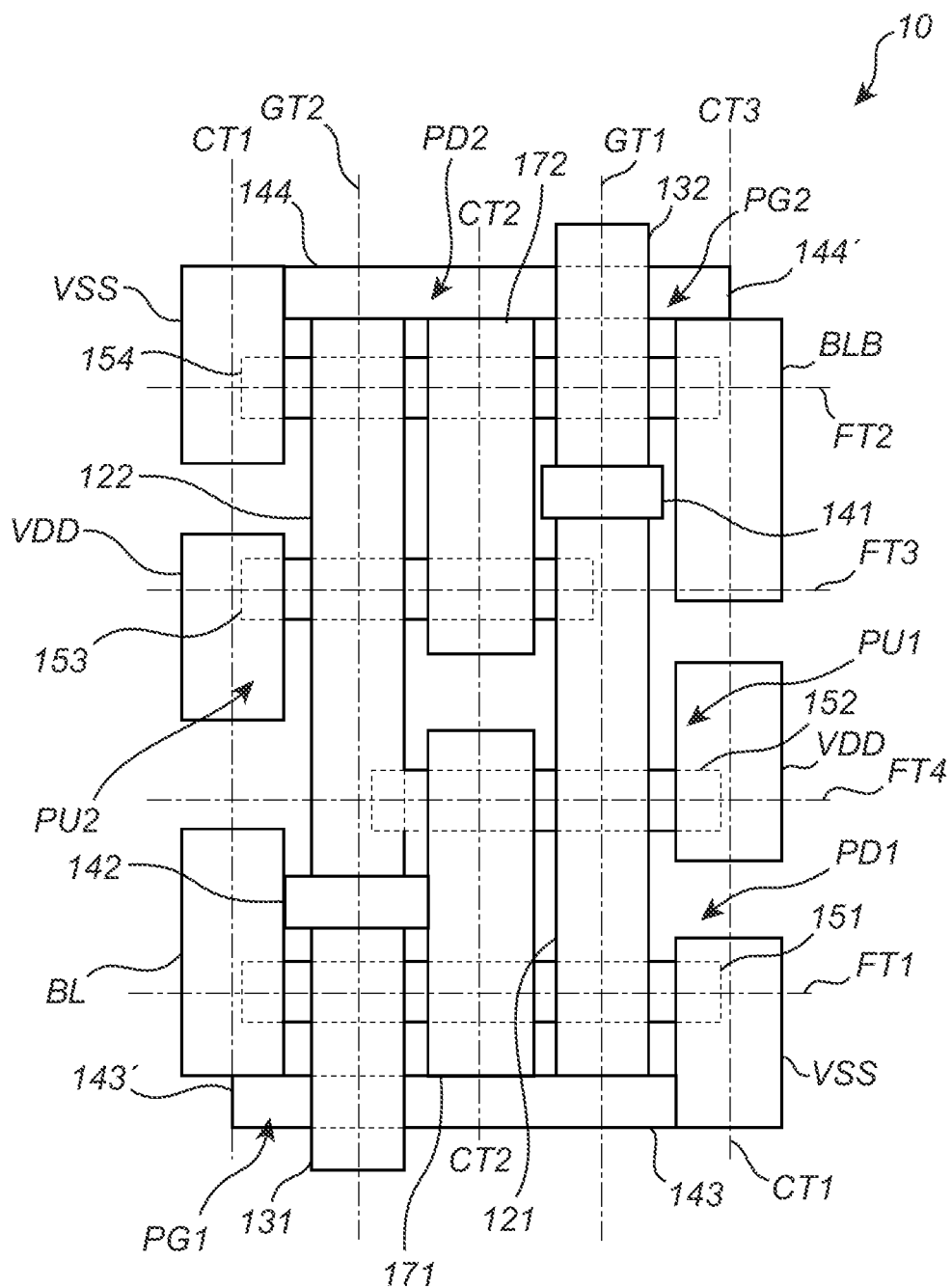
FIG. 1 is a schematic top view of a planar bit cell, according to an example embodiment.

In FIG. 1 there is shown a schematic top view of a planar bit cell 10, i.e., a bit cell in which the transistors are arranged in a common plane with relative to the semiconductor substrate. The bit cell 10 comprises a first pull-up transistor PU1 and a first pull-down transistor PD1 forming a first complementary transistor pair, as well as a second pull-up transistor PU2 and a second pull-down transistor PD2 forming a second complementary transistor pair. Further, there is provided a first pass-gate transistor PG1 and a second pass-gate transistor PG2. The first pull-down transistor PD1 and the first pass-gate transistor PG 1 are distributed along a first channel track FT1 and the second pull-down transistor PD2 and the second pass-gate transistor PG2 are distributed along a second channel track FT2. The first pull-up transistor PU1 is arranged along a third channel track FT3 and the second pull-up transistor PU2 is arranged along a fourth channel track. The channel tracks FT1-4 represent different parallel geometrical tracks or geometrical lines which the semiconductor channels of the transistors are formed along and parallel to. As will be described below, the semiconductor channels of the transistors may be formed of respective fin structures, and the channel tracks FT1-4 may therefore also be referred to as fin tracks. Accordingly, the channel tracks FT1-4 correspond to the longitudinal direction of the fin structures from which the semiconductor channels are formed.

Further indicated in FIG. 1 are first and second gate tracks GT1, GT2. The gate tracks GT1, GT2 extend transverse to and across the channel tracks FT1-4. Similar to the channel tracks FT1-4 the gate tracks GT1, GT2 represent different parallel geometrical tracks or geometrical lines along which the gate electrodes of the bit cell 10 are distributed. The gate electrode(s) may be formed in respective gate trenches in one or more dielectric layers embedding the bit cell 10. Accordingly, GT1 and GT2 may be understood as representing the longitudinal directions of the gate trenches in which the gate electrodes are formed.

A first inverter gate electrode 121 forms a common gate electrode for the semiconductor channels of the first pull-up transistor PU1 and the first pull-down transistor PD1, and a second inverter gate electrode 122 forms a common gate electrode for the semiconductor channels of the second pull-up transistor PU2 and the second pull-down transistor PD2. With this arrangement, the first inverter gate electrode 121 is allowed to control the conductivity of both semiconductor channels of the first pair of complementary transistors and the second inverter gate electrode 122 is allowed to control the conductivity of both semiconductor channels of the second pair of complementary transistors. Further, a first pass gate electrode 131 is arranged to form a gate of the first pass-gate transistor PG1 and a second pass gate electrode 132 is arranged to form a gate of the second pass-gate transistor PG2. The second pass gate electrode 132 and the first inverter gate electrode 121 are distributed along the first gate track GT1, such that they are aligned with each other. Similarly, the first pass gate electrode 131 and the second inverter gate electrode 122 are distributed along the second gate track GT2 and aligned with each other.

FIG. 1 also shows a first dielectric wall 141 formed in a trench separating the first inverter gate electrode 121 from the second pass gate electrode 132, as well as a second dielectric wall 142 formed in a trench separating the second inverter gate electrode 122 from the first pass gate electrode 131. A dielectric wall 141, 142 may hence be understood as a body extending between an end portion of an inverter gate electrode 121, 122 and an end portion of a pass gate electrode 131, 132 extending along a common gate track GT1, GT2 and arranged in mutual abutment with the body. The presence of the dielectric walls 141, 142 allows for the electrodes in the respective gate tracks GT1, GT2 to be electrically separated from each other to ensure proper operation of the bit cell 10. As indicated in the present figure, further dielectric walls 143, 143', 144, 144' may be provided to separate the inverter gate electrodes as well as signal lines BL, BLB from neighbouring devices, such as adjacent bit cells in an array of bit cells. The dielectric walls may be formed in a method outlined below in connection with FIGS. 7a-e.

Three contact tracks CT1, CT2, CT3 are also indicated in FIG. 1. The contact tracks CT1-3 extend transverse to and across the channel tracks FT1-3 and are parallel to the gate tracks GT1, GT2. The contact tracks represent different parallel geometrical tracks or geometrical lines along which the source/drain contacts of the bit cell 10 are arranged. The source/drain contacts may be formed in respective contact trenches in one or more dielectric layers embedding the bit cell 10. Accordingly, CT1-3 may be understood as representing the longitudinal directions of the contact trenches in which the source/drain contacts are formed. The source/drain contacts are arranged to connect the source/drain regions of the transistors to signal lines in the form of the complementary bit lines BL and BLB and a word line WL, as well as power supply lines VDD and VS S.

In FIG. 1 the various gate electrodes and source/drain contacts are schematically shown to be arranged on a substrate. However, as may be appreciated, one or more isolating or dielectric layers or similar may be present between the substrate and the structures arranged thereon to provide electrical isolation between the main surface of the substrate and the gate electrodes and source/drain contacts. Further, the structures formed on the substrate may be embedded in one or more dielectric layers that have been omitted from the drawings for illustrational clarity.

Although reference herein is made to "drain region"/"source region" and "drain contact"/"source contact" of a transistor it should be noted that the actual function of the region/contact may depend on the direction of the current flowing through the transistor. Hence, "drain" and "source" should be construed broadly as mere labels for the two different regions/contacts of a transistor other than the gate of the transistor. Reference to a "drain" region of a transistor may hence be interpreted as reference to a "first source/drain" region of the transistor and reference to a "source" region of the transistor as a reference to a "second source/drain" region of the transistor, and correspondingly for "source" contact and "drain" contact.

The illustrated portion of the device 10 may correspond to one functional cell in an array of a plurality of corresponding functional cells, for instance an array of identical bit cells or some other logic cell. Hence, the device 10 may comprise a plurality of regularly spaced and parallel channel tracks, a plurality of regularly spaced and parallel gate tracks, and a plurality of regularly spaced and parallel contact tracks. The tracks may together define a regular grid. The gate electrodes may be disposed at the intersections between the channel tracks and the gate tracks. The source/drain contacts may be disposed at the intersections between the channel tracks and the contact tracks. The semiconductor channels of the transistors may extend along the channel tracks, between source/drain contact pairs. A merit of using a dielectric wall for separating gate electrodes extending along the same gate tracks is that the spacing or pitch between the channel tracks may be further reduced.

The first and second pass-gate transistors PG1, PG2 may be n- or p-type FETs, such as an nMOSFET or pMOSFET. The first and second pull-up transistors PU1, PU2 may be p-type FETs, such as pMOSFETs, whereas the first and second pull-down transistors PD1, PD2 may be n-type FETs, such as nMOSFETs. Hence, the first and second complementary transistor pairs may form a respective CMOS transistor pair.

Figure 2:
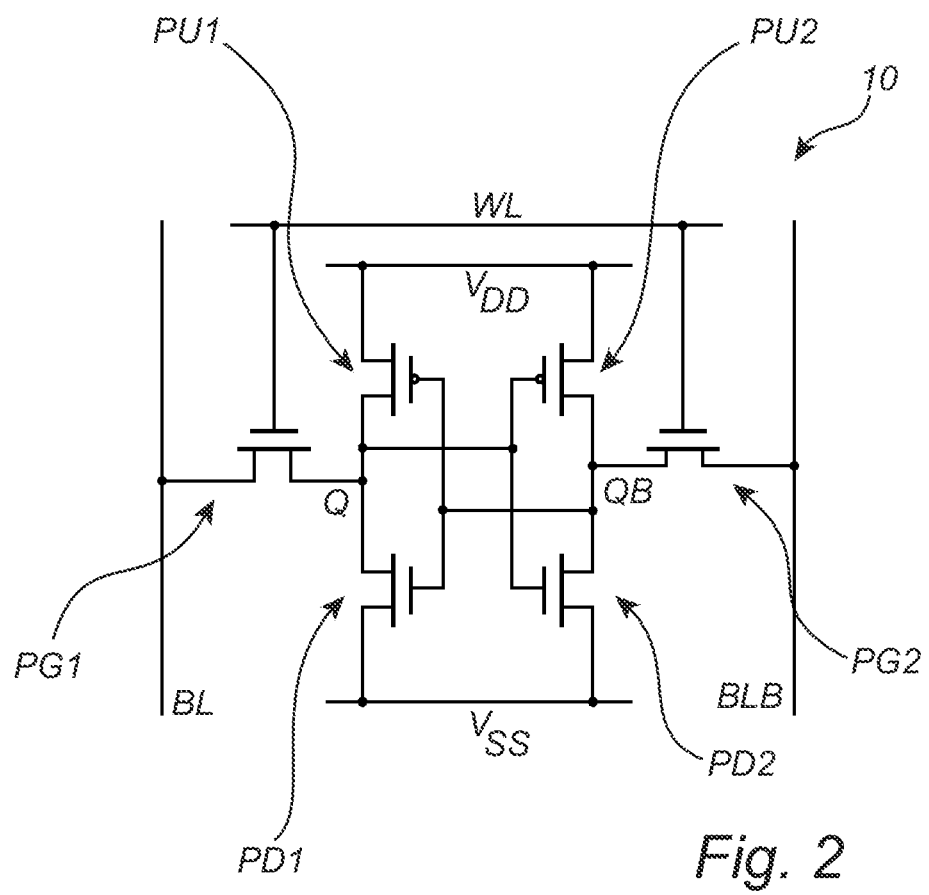
FIG. 2 shows an example circuit diagram of a bit cell of an SRAM, according to an example embodiment.

FIG. 2 shows one example circuit diagram of a planar layout of a bit cell according to an embodiment. FIG. 2 shows the bit cell 10 implemented as an SRAM bit cell and accordingly includes signal lines in the form of complementary bit lines BL and BLB and a word line WL as well as power supply rails VDD and VS S. Although the SRAM bit cell shown in FIG. 2 is a 6-transistor (6T) SRAM bit cell it should be noted that the design with the dielectric wall 141-144 also may be used in other SRAM topologies as well, such as 4 T to 10 T bit cell designs.

In the above, a bit cell 10 as described herein has mainly been described with reference to a limited number of examples. However, as is readily appreciated by a person skilled in the art, other examples than the ones disclosed above are equally possible within the scope of the present disclosure.

For instance, while FIG. 1 shows a planar layout (in which all transistors are arranged in substantially the same plane), FIGS. 3a-b, 4a-c, 5a-b and 6a-c show vertical configurations in which the transistors of each complementary pair are stacked on top of each other. Hence, a first one of the transistors of the complementary pair is arranged at a lower first level shown in FIGS. 3a and 5a and the other one of the transistors at an upper second level shown in FIGS. 3b and 5b. This bit cell layout may be referred to as a vertical layout, in which the transistors of each complementary pair are vertically stacked complementary FETs, or CFETs. Using what may be referred to as a "sequential" process, a CFET device comprising bottom and top FET devices may be formed by processing the bottom device first. Thereafter, the channel region of the upper device may be provided with a gate stack which is electrically connected to the gate stack of the bottom device. Hence, in the sequential process the gate electrodes of the lower device and the upper device may be formed as separate electrodes which are interconnected vertically to form the inverter gate electrodes 131, 132 as discussed above.

The sequential process differs from the so-called "monolithic" process, in which the bottom and top devices may be provided with a "monolithic" gate stack defining a gate electrode which is physically and electrically common to the top and bottom device. In the following, a monolithic process for forming the inverter gate electrodes will be discussed as an illustrating example.

Figure 3A:
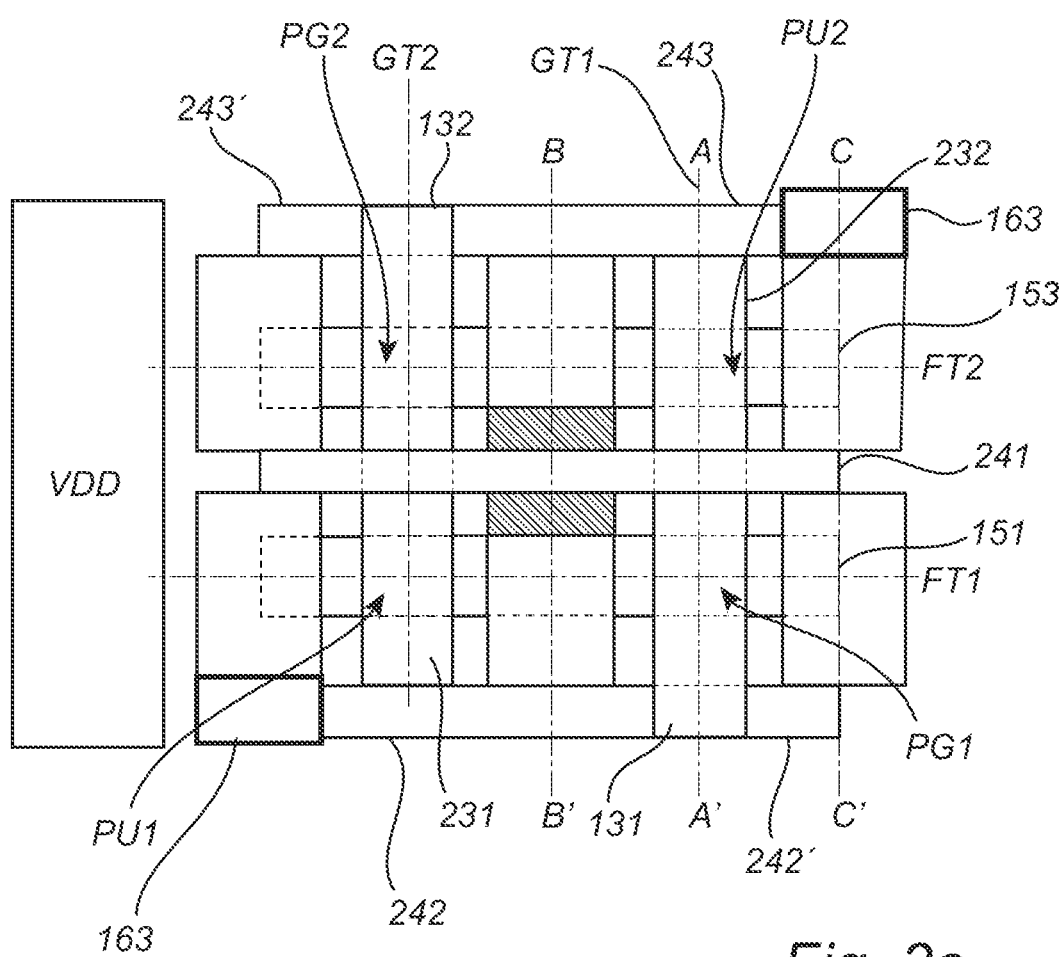
FIGS. 3a and 3b show horizontal cross sections of a stacked bit cell, taken at two different vertical levels, according to an example embodiment.
Figure 3B:
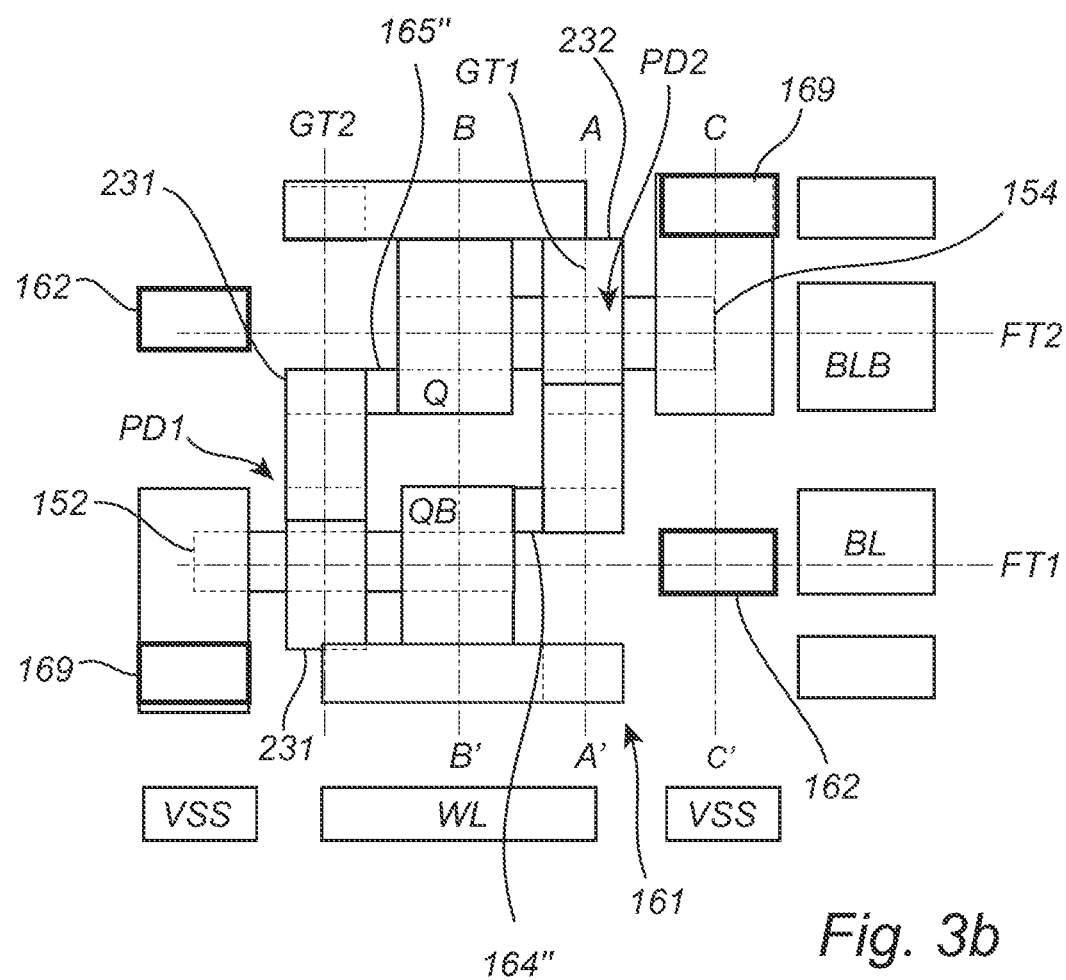

As already mentioned, FIG. 3a is a horizontal cross section of the bit cell taken at the lower horizontal level, at which the pass-gate transistors PG1, PG2 and the pull-up transistors PU1, PU2 are arranged, whereas FIG. 3b is a horizontal cross section taken at the upper horizontal level, at which the pull-down transistors PD1, PD2 are arranged. It should be noted that this is an example illustrating an embodiment of the concepts disclosed herein, and that other configurations are conceivable as well. The pass-gate transistors PG1, PG2 may in alternative layouts be arranged at the upper level instead. Further, the bit cell may comprise pull-up transistors PU1, PU2 arranged at the higher level instead, whereas the pull-down transistors PD1, PD2 may be arranged at the lower level.

FIG. 3a shows a bit cell in which a first and a fourth elongated semiconductor structure, also referred to as a fin structure, extend along a respective fin track and are separated from each other by an intermediate dielectric wall 241. The fin structure 151, 153 may comprise a channel portion, or an active region, including for example a channel fin, a channel nanowire, or a channel nanosheet, from which a resulting FET can be formed. In the present example, channel portions comprise a respective stack of nanosheets. Orthogonally to these structures, inverter gate electrodes and pass gate electrodes extend along a respective gate track passing across the fin tracks. In the example shown in FIG. 3a four gate electrodes are shown: a first pass gate electrode 131 forming a gate of the first pass-gate transistor PG1, a second pass gate electrode 132 forming a gate of the second pass-gate transistor PG2, a first inverter gate electrode 231 forming a gate of the first pull-up transistor PU1, and a second inverter gate electrode 232 forming a gate of the second pull-up transistor PU2. The first pass gate electrode 131 and the second inverter gate electrode 232 are formed sharing the same gate track and separated by the isolating wall 241, whereas the second pass gate electrode 132 and the first inverter gate electrode 231 are sharing the same gate track and separated by the isolating wall 241, which in the present example is a common wall separating the gate electrodes of both gate tracks.

FIG. 3b shows the upper layer of the same bit cell, in which a second fin structure 152 is arranged above the first pull-up transistor PU1, along the first fin track FT1, and defines the first pull-down transistor PD1. Further, a fourth fin structure 154 is arranged above the second pull-up transistor PU2, along the second fin track FT2, thereby forming the second pull-down transistor PD2. The first pull-up transistor PU1 and the first pull-down transistor PD1 hence form a first complementary pair of vertically stacked FETs, whereas second pull-up transistor PU2 and the second pull-down transistor PD2 form a second complementary pair of vertically stacked FETs. The second and fourth fin structures 152, 154 may comprise channel portions having a dopant type opposite to the one of the underlying first and third fin structures 151, 153 so as to form the complementary transistor pairs. FIG. 3b also shows the first inverter gate electrode 231, which extends vertically between the first pull-up transistor PU1 and the first pull-down transistor PD1, and the second inverter gate electrode 232 extending vertically between the second pull-up transistor PU2 and the second pull-down transistor PD2. The first and second inverter gate electrodes 231, 232 may hence form a physically and electrically common gate electrode for each of the complimentary pairs and is thus a result of a monolithic process.

FIGS. 3a and b also indicates the position of the signal lines BL, BLB and WL as well as power supply lines VDD, VSS and interconnecting structures 161, 162, 163, 169 which will be discussed in further detail in the following, with reference to FIGS. 4a-c.

Figure 4A:
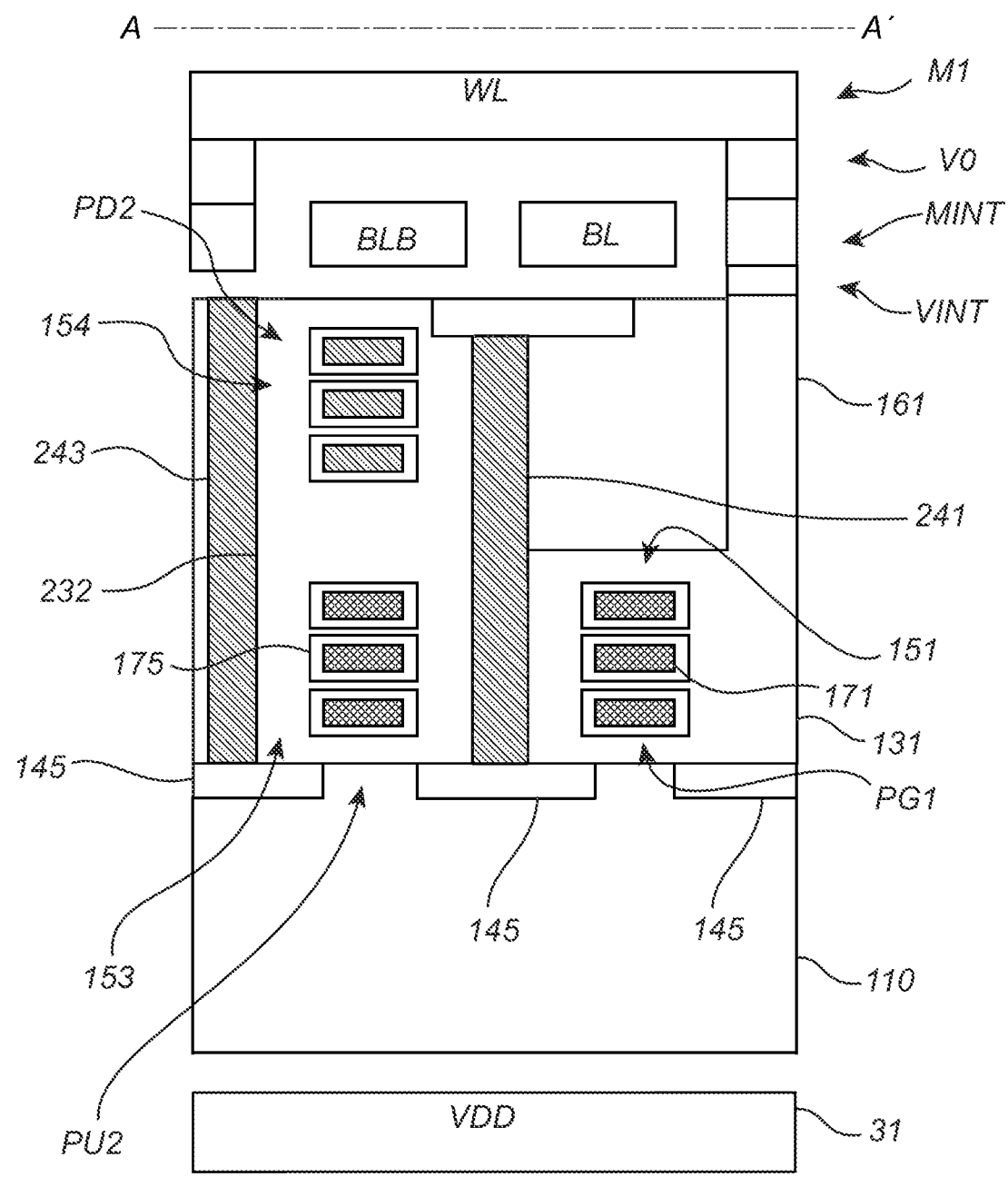
FIGS. 4a, 4b, and 4c show vertical cross sections through the bit cell in FIGS. 3a and b, according to an example embodiment.

FIG. 4a is a vertical cross section along the line A-A' indicated in FIGS. 3a-b, that is, orthogonally through the gate of the second pull-down transistor PD2, the second pull-up transistor PU2, and the first pass-gate transistor PG1. In the present example the transistor channels are formed in fin structures 151, 153, 154. Various configurations of the active regions of the fin structures 151, 153, 154 are possible. Each fin structure 151, 153, 154 may, for instance, comprises a stack of channel nanosheets 171, as illustrated in the present example. In other configurations, the active region may comprise a single channel structure, such as a fin, nanowire or nanosheet. The gate structure 175 may be a Gate All Around (GAA) structure, completely enclosing the channel structure 171, or of a so-called fork sheet type in which the gate structure wraps around only a part of the channel structure 171. In the latter case, a dielectric wall, also referred to as a fork sheet wall, may separate the channel structures 171 of the second pull-up transistor PU2 and the first pass-gate transistor PG1 from each other in the lateral direction, as will be discussed in greater detail in connection with FIG. 6a.

The nanosheets 171 in FIG. 4a may have a height to width ratio being less than one. However, other designs are also possible, such as nano-sheets having a dimension greater than a thickness dimension, or a thickness dimension greater than a lateral dimension.

The insulating dielectric wall 241 extend in FIG. 4a vertically between the first pass-gate transistor PG1 and the second pull-up transistor PU2 in the lower level shown in FIG. 3a, thereby providing electrical separation between the first pass gate electrode 131 and the second inverter gate electrode 232. The dielectric wall 241 extends from a shallow trench insulation (STI) 145 arranged at the top surface of the substrate 110 all the way up to the second pull-down transistor PD2 arranged at the upper level shown in FIG. 3b. FIG. 4a also shows a further, second dielectric wall 243 arranged to provide electrical insulation to neighbouring bit cells. Similar to the dielectric wall 241 separating the first pass gate electrode 131 from the second inverter gate electrode 232, the second dielectric wall 243 may extend vertically from an STI 145 arranged at the substrate 110 and all the way up to the second pull-down transistor PD2.

FIG. 4a also indicates the tracks for the signal lines and the power supply lines discussed above, wherein a first power supply VDD is arranged in a power rail 31 below the upper surface of the substrate 110, the complementary bit lines BL, BLB in a local interconnect layer MINT above the transistor stack, and the word line WL in a metal layer M1 arranged above the MINT layer. As indicated in the present figure, the word line WL may be connected to the first pass gate electrode PG1 by means of a vertical interconnect 161 extending from the M1, through the interconnect layers MINT, VINT and past the upper transistor layer all the way down to the lower transistor layer in which the pass-gate transistor PG1 is arranged.

Figure 4B:
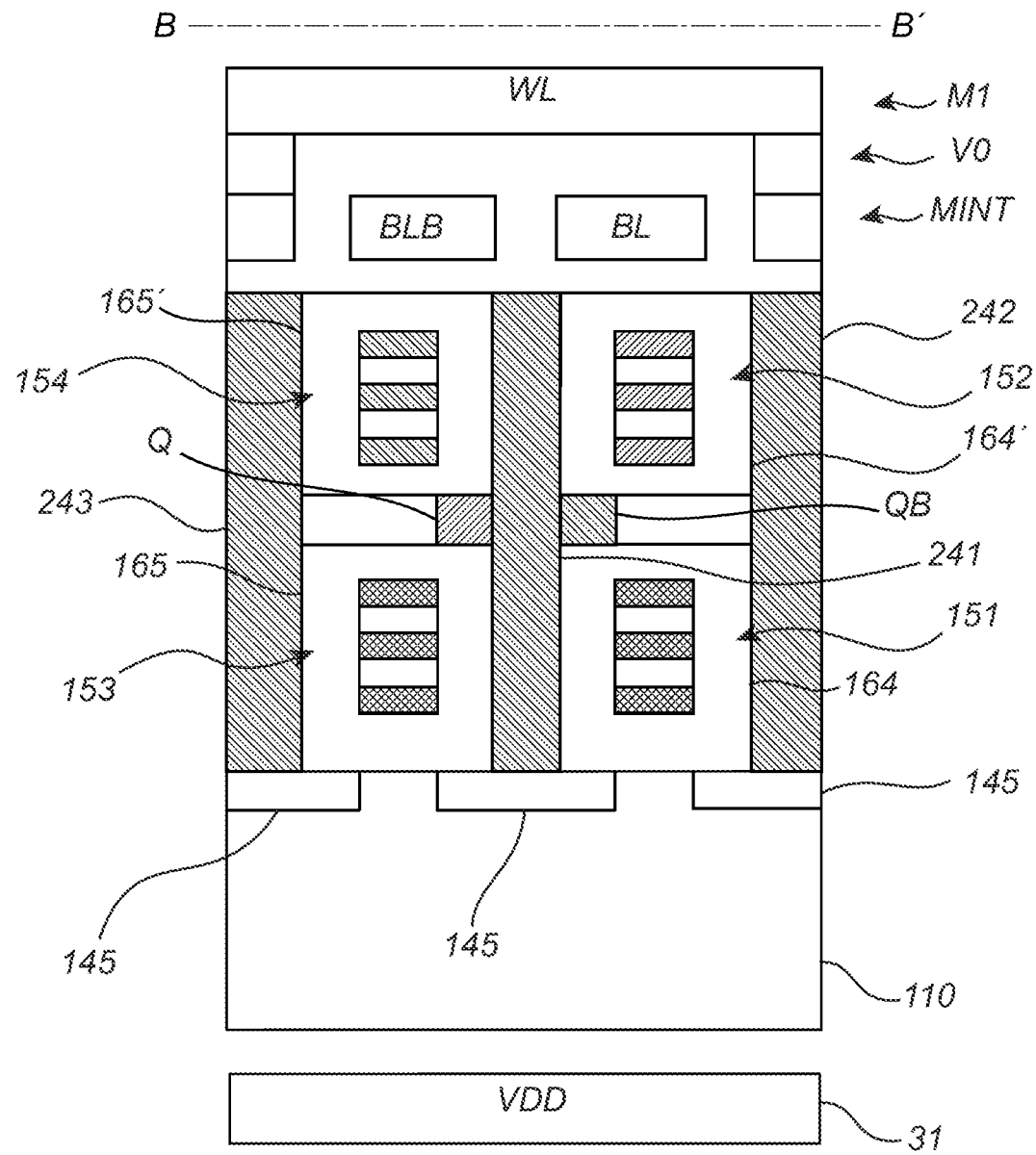

FIG. 4b is a vertical cross section along the line B-B' indicated in FIGS. 3a-b, that is, between the two pairs of complementary transistors and orthogonally through the fin structures 151-154 in which the transistors are formed. The cross section shows the interconnection structures 164, 164', interconnecting the source/drain terminals of the first pass-gate transistor PG1 and the first pull-up transistor PU1 in the lower level with the source/drain terminal of the first pull-down transistor PD1 in the upper level, as well as the interconnection structures 165, 165' interconnecting the source/drain terminals of the second pass-gate transistor PG2 and the second pull-up transistor PU2 in the lower level with the source/drain terminal of the second pull-down transistor PD2 in the upper level. Each of the top interconnection structures 164', 165' are connected to a bottom interconnection structure 164, 165 via a respective merging structure, also referred to as M0A merge, to form the internal nodes Q, QB of the bit cell. The dielectric walls 241, 242, 243 are also shown, extending vertically from a respective STI 145.

Figure 4C:
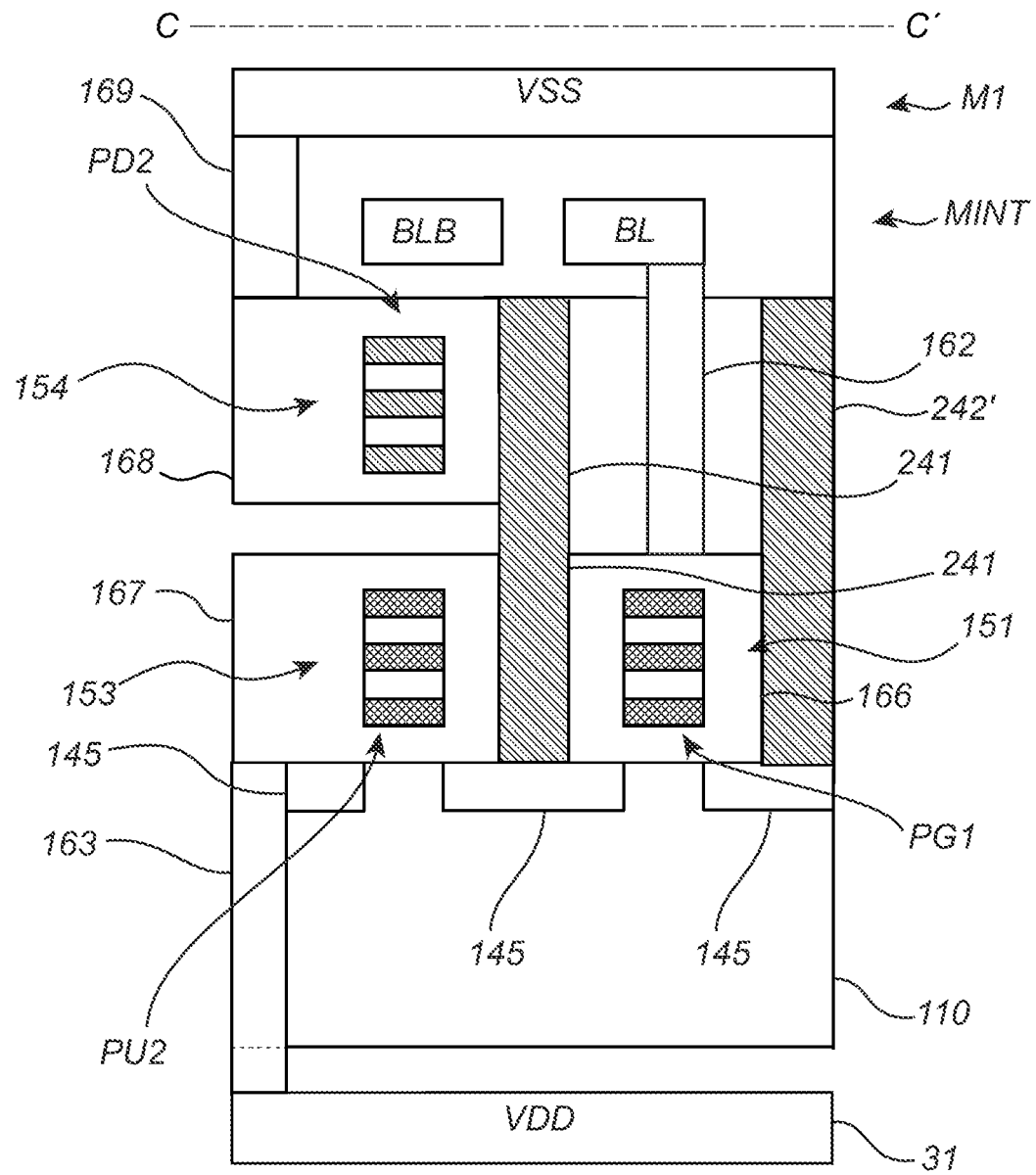
Figure 5A:
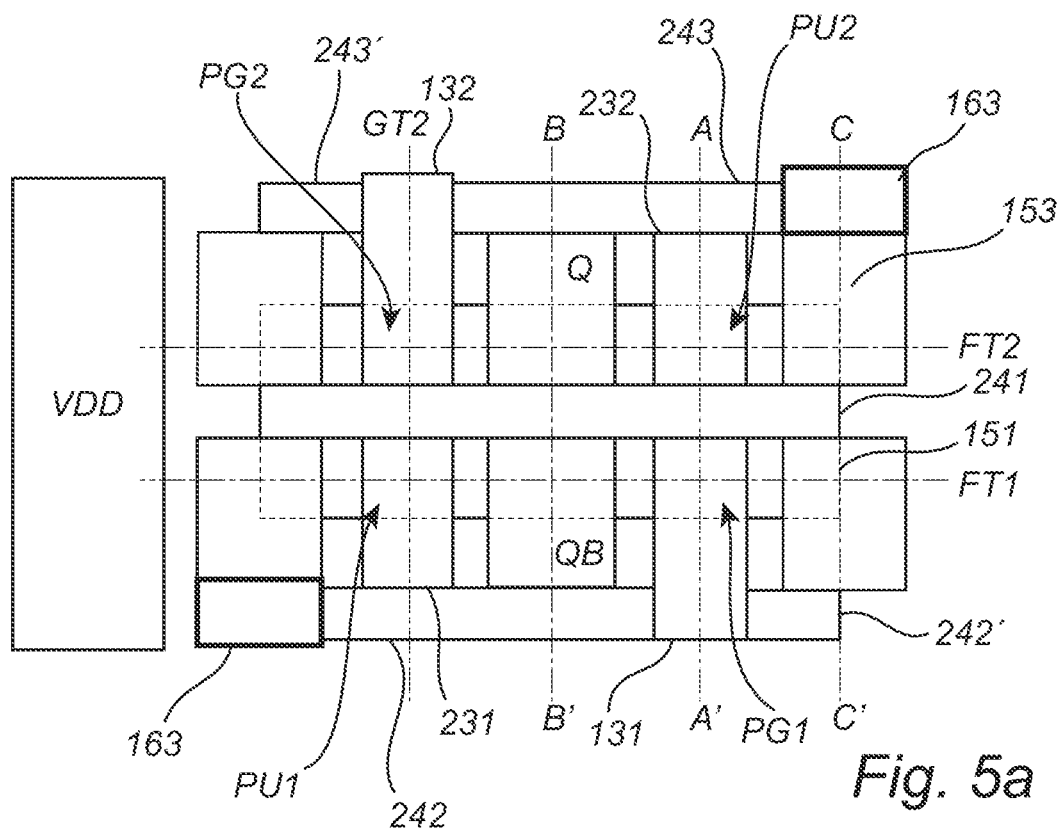
FIGS. 5a and 5b show horizontal cross sections of a stacked bit cell, taken at two different vertical levels, according to an example embodiment.
Figure 5B:
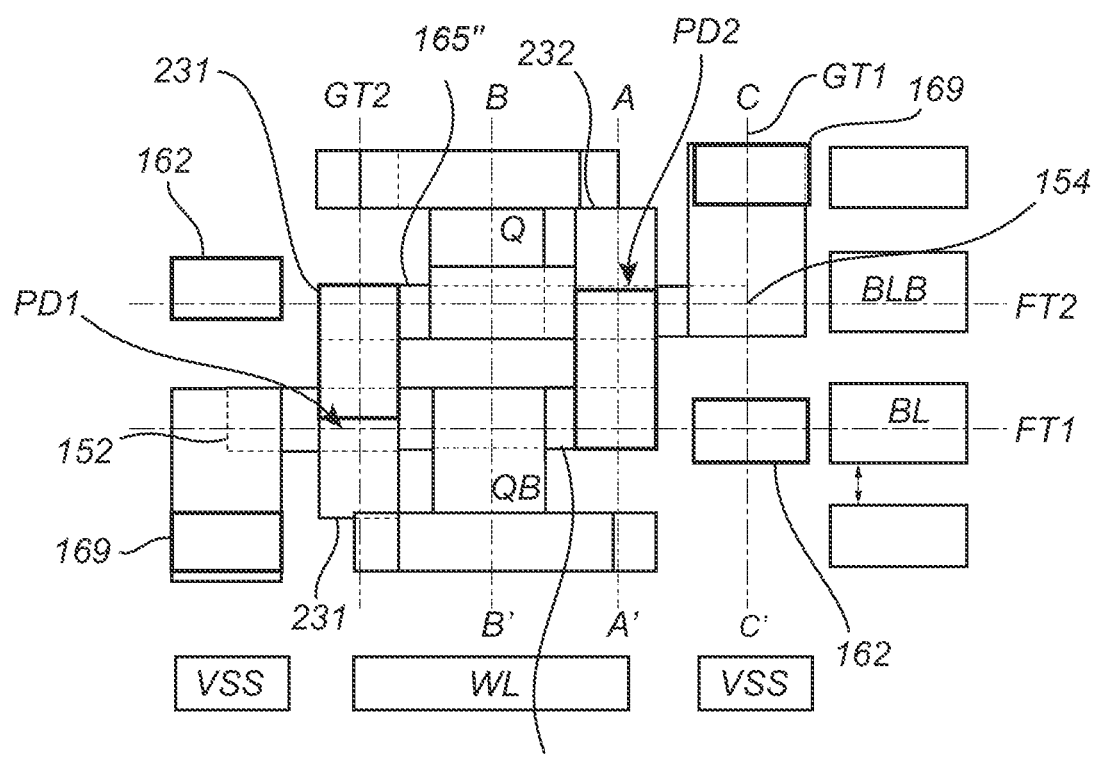

FIG. 4c is a similar cross section as the ones in FIGS. 4a and b, taken across line C-C' in FIGS. 3a and b. This cross section is hence taken through the source/drain region of the first pass-gate transistor PG1 formed in the first fin structure 151, through the source/drain region of the second pull-up transistor PU2 formed in the third fin structure 153, and through the source/drain region of the second pull-down transistor PD2 formed in the fourth fin structure 154. The isolating wall 241 is shown also in this figure, extending vertically from the STI 145 at the substrate 110 and between the first pass-gate transistor PG1 and the second pull-up transistor PU2 in the lower level shown in FIG. 3*a* up to the second pull-down transistor PD2 in the upper level shown in FIG. 3*b*.

The bit line BL is here connected to the source/drain contact 166 of the first pass-gate transistor PG1 by means of a vertical interconnect 162 extending from the MINT down to the lower level in which the pass-gate transistor PG1 is arranged. The power supply VDD is also shown, connected to the source/drain contact 167 of the second pull-up transistor PU2 from below by means of a through-silicon via 163 extending vertically from the power rail 31 up to the lower level in which the pull-up transistor PU2 is arranged. Further, power supply VSS is connected to the upper-level pull-down transistor PD2 by means of a via 169, passing from the metal layer M1 through the interconnect layer MINT down to the source/drain contact 168 of the second pull-down transistor PD2.

Figure 6A:
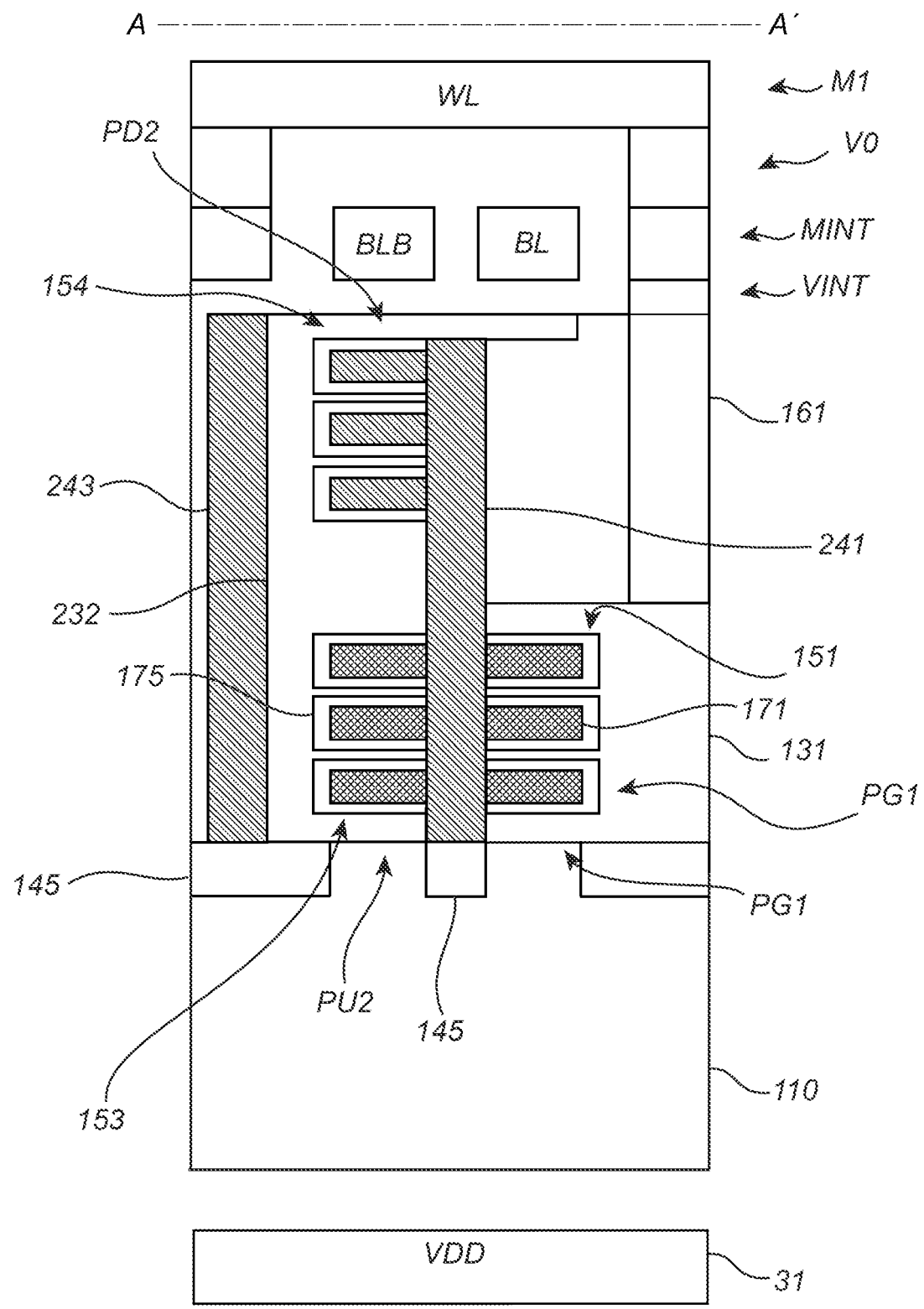
FIGS. 6a, 6b, and 6c show vertical cross sections through the bit cell in FIG. 5 and b, according to an example embodiment.
Figure 6B:
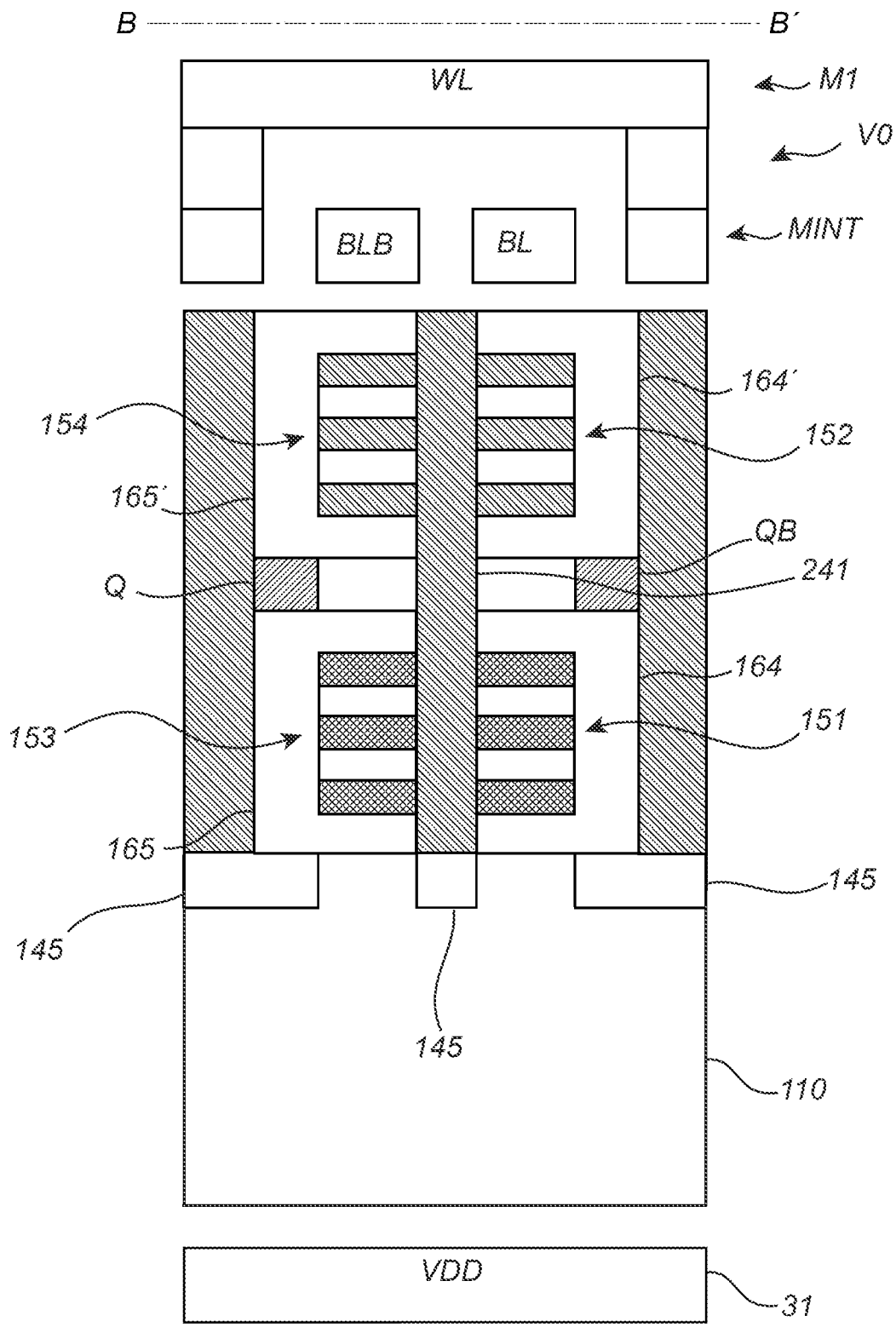
Figure 6C:
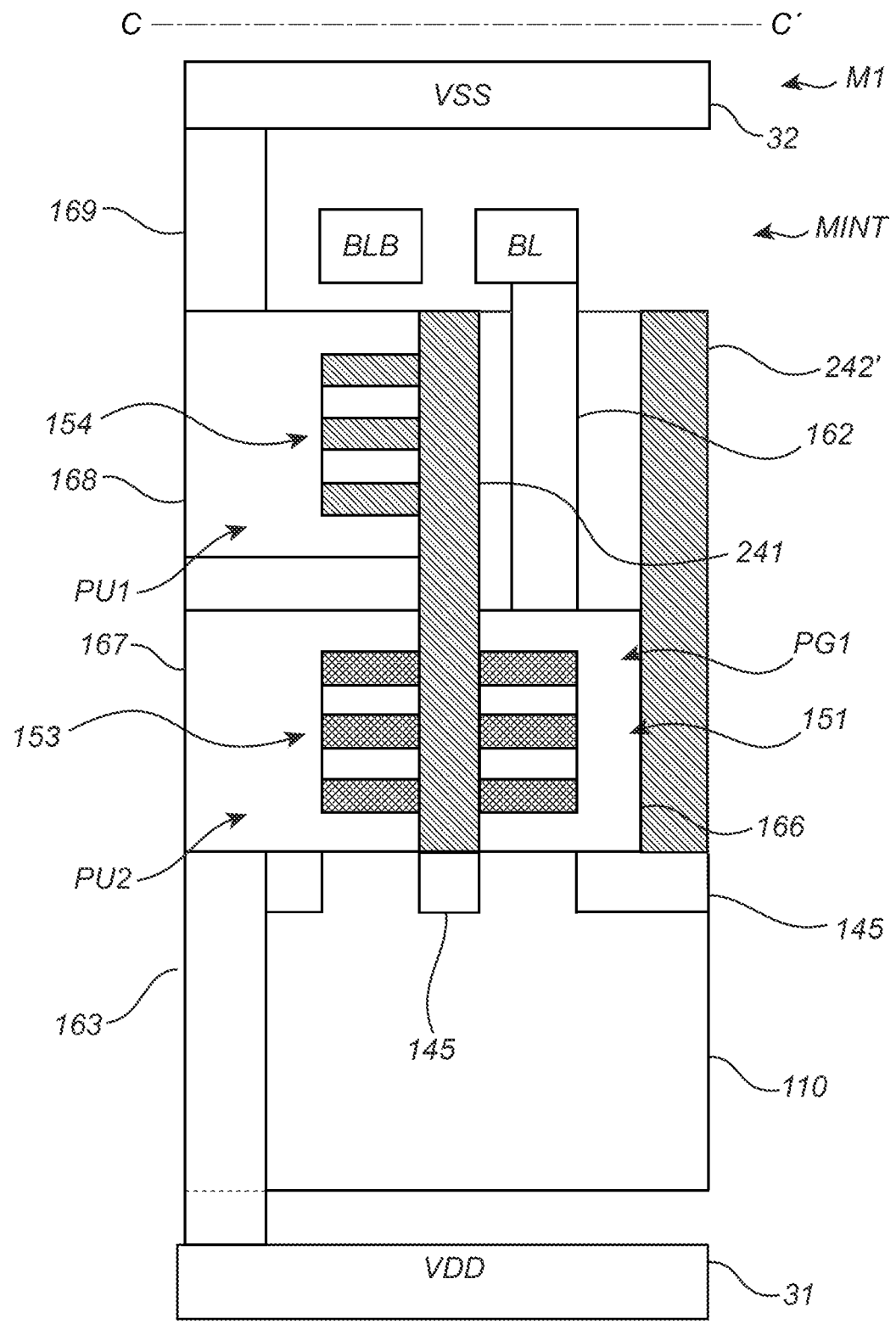

As mentioned above, in further example embodiments the CFETs of the bit cell 10 may comprise so called forksheet FETs, in which a dielectric wall is formed between the channel nanosheets of the transistors, sharing the same gate track GT1, GT2, before gate patterning. As a result, the gate electrodes are not completely wrapping around the gate regions. Instead, the gate electrodes wrap around the parts of the channel regions which do not abut the dielectric wall, as is shown in FIGS. 6*a-c*.

FIGS. 5*a-b* and 6*a-c* show a similar bit cell layout as the one shown in FIGS. 3*a-b* and 4*a-c*. A general reference is therefore made to the above description of FIGS. 3*a-b* and 4*a-c*.

However, due to the forksheet layout of the FETs, the fin tracks FT1, FT2 are allowed to be arranged at an even tighter spacing, since the fin structures 151-154 can be arranged in direct contact with the dielectric wall 241. The benefits of the forksheet layout will be appreciated when studying the cross sections in FIGS. 6*a-c*, in which the tighter, horizontal spacing between the first and third fin structures 151, 153 in the lower level as well as between the second and fourth fin structures 152, 154 in the upper level is shown. By forming the dielectric wall 241 between the fin structures 151-154 prior to patterning the gate electrodes 175 at the nanosheets 171, a tighter pitch between transistors at the same vertical level (such as the first pass-gate transistor PG1 and the second pull-up transistor PU2 in FIG. 6*a*) can be achieved.

A method for forming a dielectric wall in a bit cell similar to the ones disclosed above in connection with FIGS. 1-6 will now be discussed with reference to the perspective views in FIGS. 7*a-e*. It should be noted that the proposed method is an illustrating example and that other methods are possible as well, depending on the particular performance requirements and the layout of the bit cell 10.

Figure 7A:
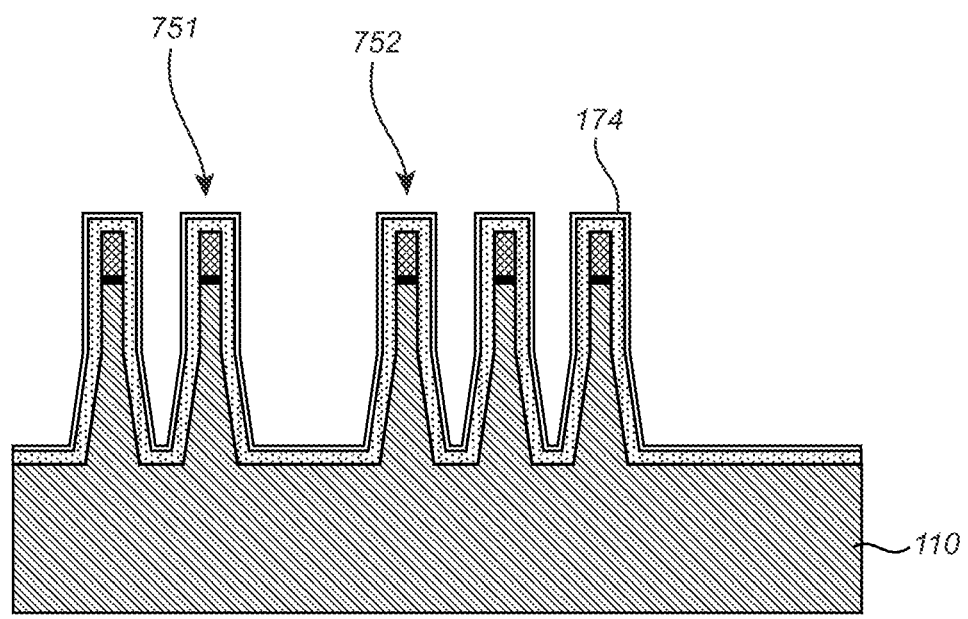
FIGS. 7a, 7b, 7c, 7d, and 7e are perspective views illustrating various steps during the formation of a dielectric wall, according to an example embodiment.

In FIG. 7*a*, a plurality of elongated semiconductor structures 751, 752 has been formed on a substrate 110. The substrate 110 may be a conventional semiconductor substrate suitable for CMOS processing. The substrate 110 may be a single-layered semiconductor substrate, for instance formed by a bulk substrate such as a Si substrate, a germanium (Ge) substrate or a silicon-germanium (SiGe) substrate. A multi-layered/composite substrate is however also possible, such as an epitaxially grown semiconductor layer on a bulk substrate, or a semiconductor-on-insulator (SOI) substrate.

Each of the plurality of elongated semiconductor structures 751, 752 may be formed by an elongated fin-shaped layer stack with a longitudinal dimension oriented in a first horizontal direction along the substrate 110 and protruding in a vertical direction from the substrate 110. The elongated semiconductor structures 751, 752 may hence be referred to as fin structures. A width dimension of the fin structure is oriented in a second horizontal direction transverse to the first horizontal direction.

Each fin structure 751, 752 may comprise, in a bottom-up direction, a lower device sub-stack, a middle insulating layer on the lower device sub-stack, and an upper device sub-stack on the middle insulating layer (not shown in FIGS. 7*a-e*). The device sub-stacks may be considered to correspond to the fin structures 151-154 shown in FIGS. 3-6. In the present figures, a capping layer 174 is arranged on the fin structure 751 752.

Various configurations of the sub-stacks are possible. Each sub-stack may, for instance, comprise a number of channel nanosheets and a number of sacrificial nanosheets arranged alternatingly with the channel nanosheets, as seen along the vertical direction. In other configurations, a sub-stack may comprise a single channel structure, such as a fin, nanowire or nanosheet.

The sacrificial nanosheets may be formed of a semiconductor material ("sacrificial material") different from a semiconductor material of the channel nanosheets ("channel material") and selected to be removable selectively to the channel material. As used herein, the term "selective" in connection with removal of a material or feature (e.g., a layer or layer portion) means that the material of feature is removed/removable using an etching process etching the material/feature at a rate greater than another material/feature exposed to the etching process. The sacrificial material may be $SiGe_x$ and the channel material $SiGe_y$, wherein x, y≥0 and y≠x. A difference in Ge-content of the sacrificial material and the channel material may facilitate a selective removal of the sacrificial material with respect to the channel material.

A channel material of Si in the lower sub-stacks and a channel material of SiGe in the upper sub-stacks allows for a CFET device comprising a lower FET of an n-type and an upper FET of a p-type to be formed. A SiGe upper channel material may enable forming of a strained upper channel layer, which may improve the performance of the channel for the upper FET. More generally, the Ge-content of the channel material of the lower and upper FET devices may be selected to optimize the channel properties for the devices.

The nanosheets and layers of the fin structures may each be epitaxial nanosheets and layers, e.g. formed of epitaxially grown or deposited semiconductor material. Epitaxial techniques, such as chemical vapour deposition (CVD) or physical vapour deposition (PVD) of Si and SiGe, allowing forming of high-quality material crystalline (e.g. single-crystalline) nanosheets or layers are per se known in the art.

The middle insulating layer may be formed of an insulating material, such as an oxide or a nitride. For example, the middle insulating layer may comprise or be formed of $SiO_2$, SiN, SiC, SiCN, SiOCN, SiOBCN or SiON. Although referred to and illustrated as a single layer, the middle insulting layer may also be formed as a composite layer structure comprising a stack of two or more different insulating layers.

The fin structures 751, 752 may be patterned by using a hard mask layer as an etch mask. Conventional patterning techniques may be used for patterning the hard mask layer, e.g., single patterning techniques such as lithography and etching ("litho-etch") or multiple-patterning techniques such as (litho-etch)$^x$, self-aligned double or quadruple patterning (SADP or SAQP). The pattern defined by the hard mask may then be transferred into the layer stack by etching using the hard mask as an etch mask, resulting in the parallel fin-structure 751, 752 extending along fin tracks FT1-FT4 as shown in e.g. FIG. 1.

Figure 7B:
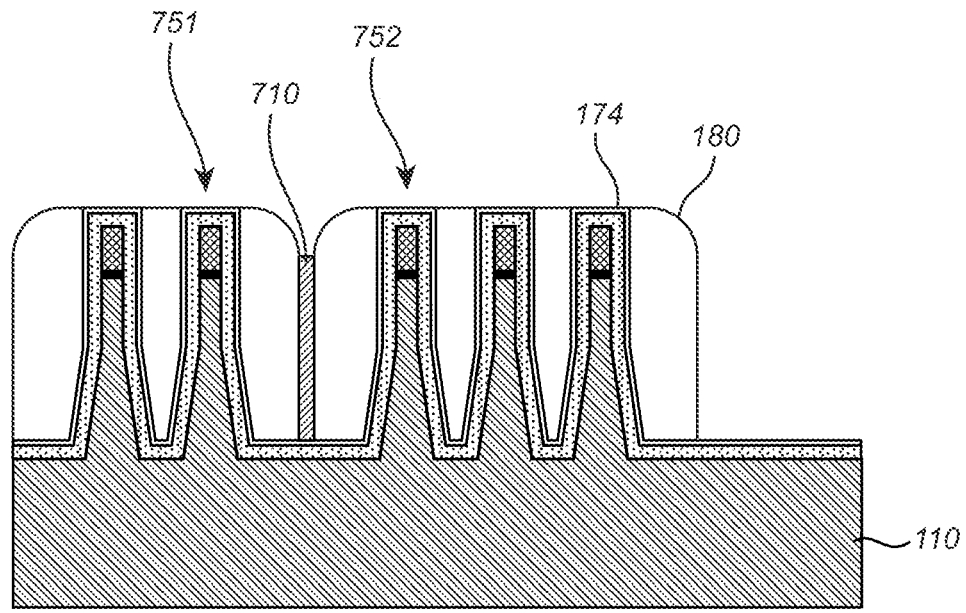

In FIG. 7b a spacer material layer 180 has been conformally deposited on the fin structures 751, 752 to form a reduced-width gap between the fin structures 751, 752. The gap is then filled with a dielectric material forming a dielectric isolating wall 710, which may correspond to the isolating walls 242, 242', 243, 243' shown in for example FIG. 3a. The spacer material layer may for example be an ALD-deposited nitride or carbide, such as SiN, SiCO, SiOCN, or SiC, or amorphous silicon (a-Si). The spacer material layer may be etched back (e.g., top-down, in the vertical direction towards the substrate) using an anisotropic etch process, such as reactive ion etching. It will be appreciated that the spacer layer 180 allows the width of the gap between neighbouring fin structures 751, 752 to be trimmed to define the thickness of the dielectric wall 710 formed therebetween. Beneficially, this process allows the dielectric wall 710 to be self-aligned between the channel tracks FT1-FT4. The dielectric wall 710 may be formed by conformal deposition of a dielectric material such as, for instance, SiCO or $Al_2O_3$, which may be added in single layer or a plurality of layer.

Figure 7C:
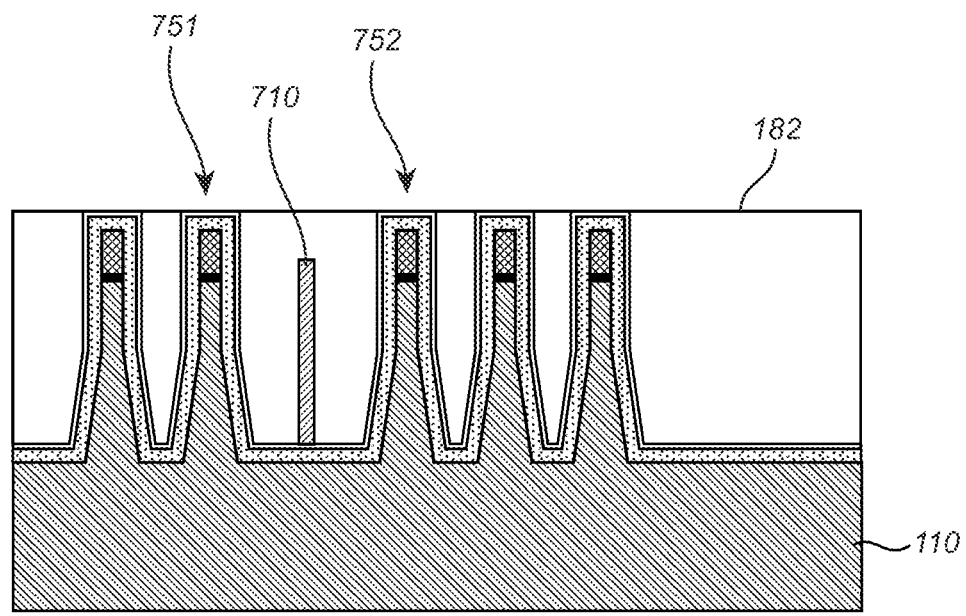

In FIG. 7c an isolating material 182, such as $SiO_2$, has been deposited conformally over the fin structures 751, 752 the spacer layers 180 and the dielectric wall 710. The isolating material 182 may be of the same type as the spacer layer 180, which hence may be considered to have been "topped up" in FIG. 7c. A CMP process has then been performed to remove excess material, landing on the capping layer 174.

Figure 7D:
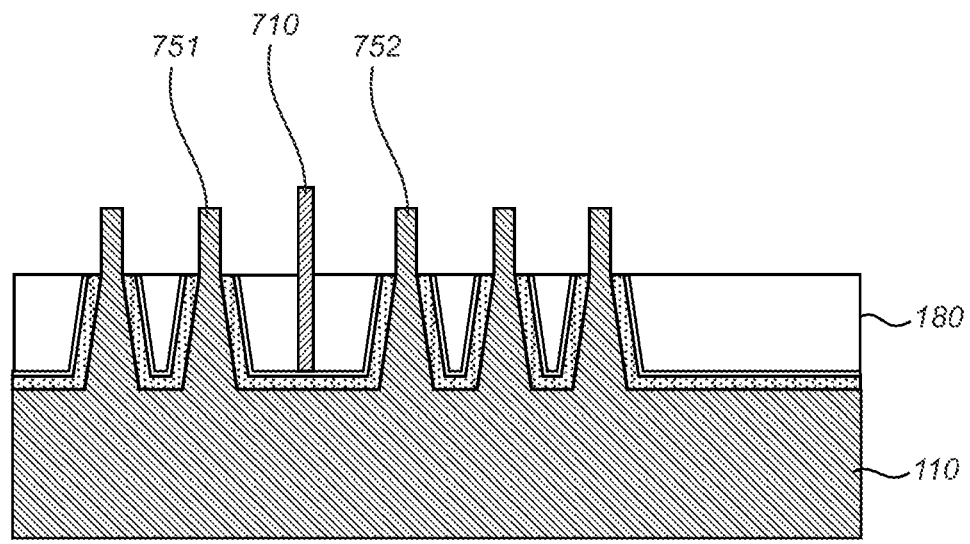

In FIG. 7d, a fin reveal process has been performed, in which the isolating material 182 has been etched back and the top portion of the fin structures 751, 752 as well as the top portion of the dielectric wall 710 have been revealed.

Figure 7E:
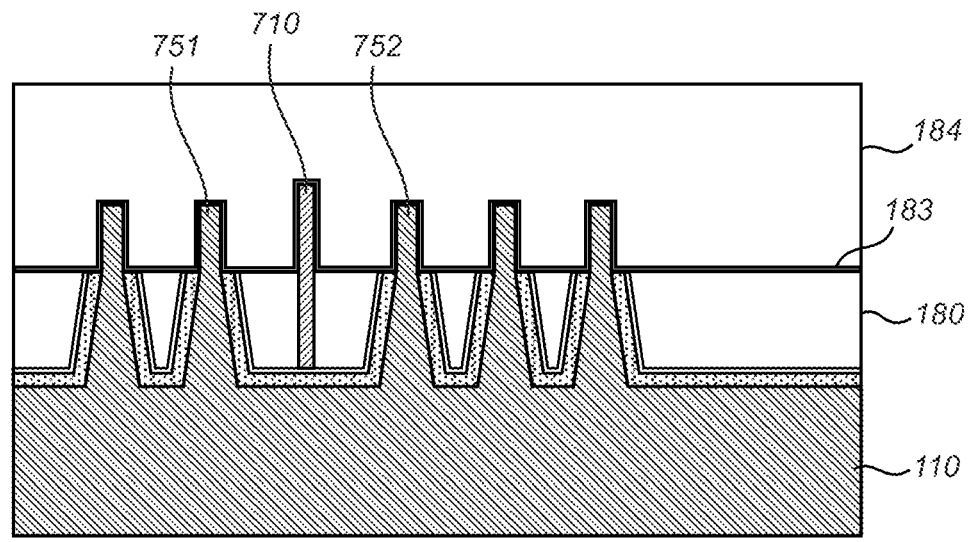

Thereafter, an additional layer 183 of e.g. $SiO_2$ followed by a dummy gate layer 184 of e.g. a-Si has been formed, as shown in FIG. 7e. The dummy gate layer 184 may form part of a RMG process, resulting in the formation of a final gate stack replacing the dummy gate. The final gate stack may comprise a gate dielectric layer, one or more effective work function metal (WFM) layers and a gate fill metal. The gate dielectric layer may be formed of a conventional high-k dielectric, such as $HfO_2$, HfSiO, LaO, AlO or ZrO. The WFM layer may be formed of one or more effective WFMs (e.g. an n-type WFM such as TiAl or TiAlC and/or a p-type WFM such as TiN or TaN). The gate fill metal may be formed of conventional gate fill metals, such as W, Al, Co or Ru.

After the gate forming process, the method may proceed with forming source/drain contacts as well as interconnect structures, resulting in the structure shown in for example FIGS. 3a-b, 4a-c, 5a-b and 6a-c.

In the above the various embodiments herein have mainly been described with reference to a limited number of examples. However, as is readily appreciated by a person skilled in the art, other examples than the ones disclosed above are equally possible within the scope of the present disclosure, for example those defined by the appended claims.

What is claimed is:

1. A bit cell for a Static Random-Access Memory (SRAM) arranged on a semiconductor substrate, the bit cell comprising:

a first pair of complementary transistors including a first pull-up transistor and a first pull-down transistor;

a second pair of complementary transistors including a second pull-up transistor and a second pull-down transistor;

a first pass-gate transistor; and a second pass-gate transistor;

wherein each transistor of the bit cell comprises a respective semiconductor channel extending between respective source and drain regions along a respective horizontal channel track;

and wherein the bit cell further comprises:

a first inverter gate electrode forming a common gate electrode for the semiconductor channels of the first pair of complementary transistors and a second inverter gate electrode forming a common gate electrode for the semiconductor channels of the second pair of complementary transistors, wherein the first and the second inverter gate electrodes extend in a respective horizontal gate track transverse to the channel tracks;

a first pass gate electrode forming a gate of the first pass-gate transistor and being aligned with the first inverter gate electrode;

a second pass gate electrode forming a gate of the second pass-gate transistor and being aligned with the second inverter gate electrode;

a first dielectric wall formed in a trench separating the first pass gate electrode from the first inverter gate electrode; and a second dielectric wall formed in a trench separating the second pass gate electrode from the second inverter gate electrode.

2. The bit cell of claim 1, wherein the semiconductor channel of each transistor of the bit cell is arranged in a common horizontal plane.

3. The bit cell of claim 1, wherein the semiconductor channels of the first pull-down transistor and the first pass-gate transistor are aligned in a common first channel track, and wherein the semiconductor channels of the second pull-down transistor and the second pass-gate transistor are aligned in a common second channel track.

4. The bit cell of claim 1, wherein the first and second pair of complementary transistors are arranged in respective vertical stacks, and wherein each of the first and second inverter gate electrodes further extend vertically between the pull-up transistor and the pull-down transistor of the respective pair of complementary transistors.

5. The bit cell of claim 4, wherein:

the semiconductor channels of the first pull-up transistor and the first pass-gate transistor are aligned in a common first channel track;

the semiconductor channels of the second pull-up transistor and the second pass-gate transistor are aligned in a common second channel track; and the first channel track and the second channel track are arranged at a first vertical level above the substrate.

6. The bit cell of claim 5, wherein the first and second pull-down transistor are arranged at a second vertical level above the first level.

7. The bit cell of claim 6, wherein the first and second dielectric walls extend vertically between the first and second level and horizontally between the vertical stacks of complimentary transistors.

8. The bit cell of claim 7, wherein first and second dielectric walls form a common wall.

9. The bit cell of claim 1, wherein an average thickness of the first dielectric wall is nm or less.

10. The bit cell of claim 1, wherein the semiconductor channel of each transistor of the bit cell is formed of a respective fin portion, nanosheet portion, or nanowire portion.

11. The bit cell of claim 1, wherein the semiconductor channel of each transistor of the bit cell comprises a vertical stack of fin portions.

12. A method for forming a bit cell for a Static Random-Access Memory (SRAM) comprising forming, on a semiconductor substrate:
a first pair of complementary transistors including a first pull-up transistor and a first pull-down transistor;
a second pair of complementary transistors including a second pull-up transistor and a second pull-down transistor;
a first pass-gate transistor; and
a second pass-gate transistor;
wherein each transistor of the bit cell comprises a semiconductor channel extending between respective source and drain regions along a respective horizontal channel track;
wherein forming the first pair of complementary transistors comprises forming a first inverter gate electrode at the semiconductor channel of the first pair of complementary transistors, thereby providing a common gate electrode for the first pair of complementary transistors;
wherein forming the second pair of complementary transistors comprises forming a second inverter gate electrode at the semiconductor channel of the second pair of complementary transistors, thereby providing a common gate electrode for the second pair of complementary transistors;
wherein forming the first and second pass-gate transistors comprises forming a first pass-gate electrode forming a gate of the first pass-gate transistor, aligned with the first inverter gate electrode, and forming a second pass-gate electrode forming a gate of the second pass-gate transistor, aligned with the second inverter gate electrode; and
wherein the method further comprises:
forming a trench separating the first pass gate electrode from the first inverter gate electrode and filling the trench with a dielectric material, thereby forming a first dielectric wall separating the first pass gate and the first inverter gate electrode; and
forming a trench separating the second pass gate electrode from the second inverter gate electrode and filling the trench with a dielectric material, thereby forming a second dielectric wall separating the second pass gate and the second inverter gate electrode.

13. The method of claim 12, wherein the semiconductor channel of each transistor of the bit cell is formed in a respective fin structure extending along the horizontal channel tracks.

14. The method of claim 13, wherein the trenches are formed between spacers arranged on opposite side surfaces of the fin structures.

15. The method of claim 12, wherein the semiconductor channels of the first pull-down transistor and the first pass-gate transistor are aligned in a common first channel track, and wherein the semiconductor channels of the second pull-down transistor and the second pass-gate transistor are aligned in a common second channel track.

16. The method of claim 12, wherein the first and second pair of complementary transistors are arranged in respective vertical stacks, and wherein each of the first and second inverter gate electrodes further extend vertically between the pull-up transistor and the pull-down transistor of the respective pair of complementary transistors.

17. The method of claim 16, wherein:
the semiconductor channels of the first pull-up transistor and the first pass-gate transistor are aligned in a common first channel track;
the semiconductor channels of the second pull-up transistor and the second pass-gate transistor are aligned in a common second channel track; and
the first channel track and the second channel track are arranged at a first vertical level above the substrate.

18. The method of claim 17, wherein the first and second pull-down transistor are arranged at a second vertical level above the first level.

19. The method of claim 18, wherein the first and second dielectric walls extend vertically between the first and second level and horizontally between the vertical stacks of complimentary transistors.

20. The method of claim 19, wherein the first and second dielectric walls form a common wall.

* * * * *